(12) United States Patent
Zielbauer

(10) Patent No.: US 7,190,753 B2
(45) Date of Patent: Mar. 13, 2007

(54) METHOD AND APPARATUS FOR TEMPORALLY CORRECTING A DATA SIGNAL

(75) Inventor: Jürgen Zielbauer, München (DE)

(73) Assignee: Infineon Technologies AG, Munich (DE)

( * ) Notice: Subject to any disclaimer, the term of this patent is extended or adjusted under 35 U.S.C. 154(b) by 803 days.

(21) Appl. No.: 09/947,296

(22) Filed: Sep. 5, 2001

(65) Prior Publication Data
US 2002/0041649 A1 Apr. 11, 2002

(30) Foreign Application Priority Data
Sep. 5, 2000 (DE) ................. 100 43 730

(51) Int. Cl.
*H04L 25/40* (2006.01)
(52) U.S. Cl. .............. 375/371; 375/344; 370/516; 327/153; 455/182.1; 455/192.1
(58) Field of Classification Search ........... 375/324, 375/340, 344, 354, 371–376; 370/516, 517, 370/521; 327/141, 149, 150, 153, 159, 161; 455/182.1, 182.2, 192.1, 192.2
See application file for complete search history.

(56) References Cited

U.S. PATENT DOCUMENTS

| | | | |
|---|---|---|---|
| 4,746,819 A | 5/1988 | Kashiwagi | |
| 5,124,656 A | 6/1992 | Yassa et al. | |
| 5,336,940 A | 8/1994 | Sorrells | |
| 5,663,925 A | 9/1997 | Vo | |
| 5,790,613 A * | 8/1998 | Tateishi | 375/376 |
| 6,016,329 A * | 1/2000 | Iwasaki | 375/340 |
| 6,603,821 B1 * | 8/2003 | Doi | 375/326 |

FOREIGN PATENT DOCUMENTS

| | | |
|---|---|---|
| DE | 198 60 909 A1 | 9/1999 |
| EP | 0 930 709 A1 | 7/1999 |
| JP | 10242819 A | 9/1998 |
| JP | 2000/124805 | 4/2000 |

\* cited by examiner

*Primary Examiner*—Dac V. Ha
(74) *Attorney, Agent, or Firm*—Laurence A. Greenberg; Werner H. Stemer; Ralph E. Locher

(57) ABSTRACT

A data signal is detected and compared with a reference value. A displacement time is determined as a function of the difference between the reference value and the signal level of the data signal. The data signal is buffer-stored and output in a manner that is temporally delayed by the displacement time. Accordingly, the data signal has a predetermined value at a predetermined point in time after the buffer-storage. Consequently, the data signal waveform can be defined with respect to time. As a result, a precise signal waveform is prescribed, and time periods for detecting the data signal can be precisely defined.

7 Claims, 2 Drawing Sheets

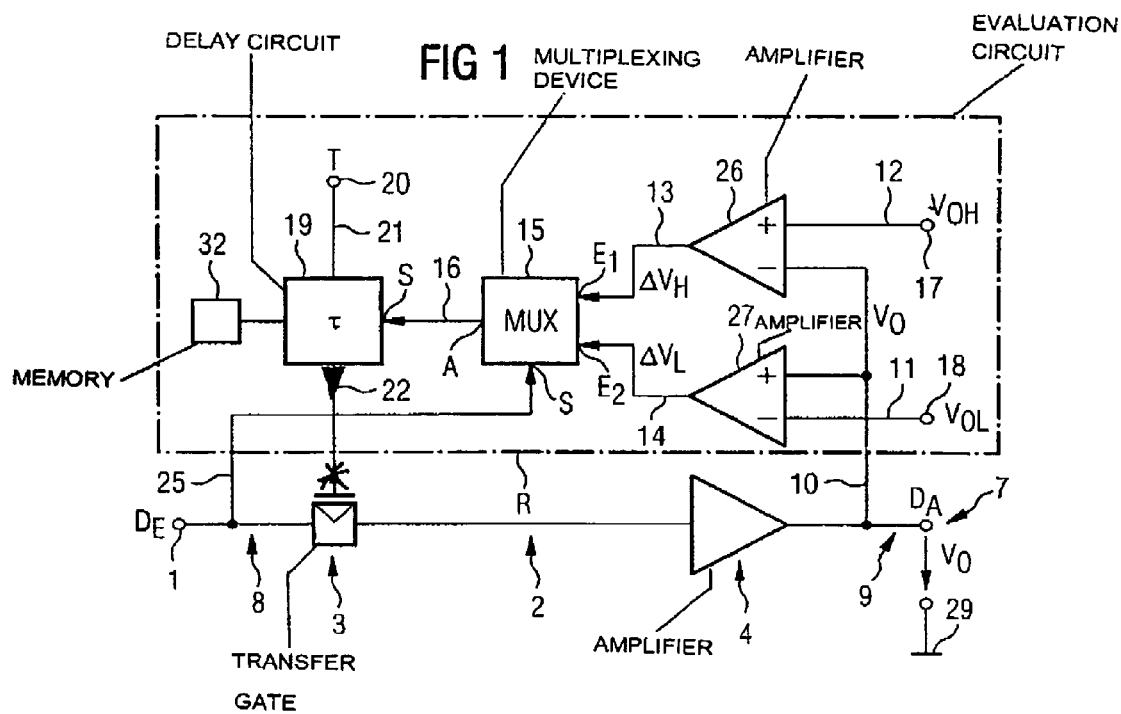
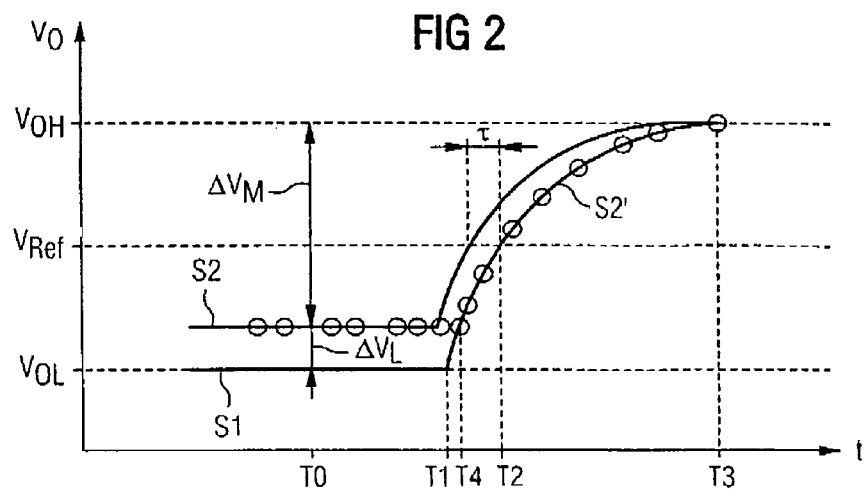

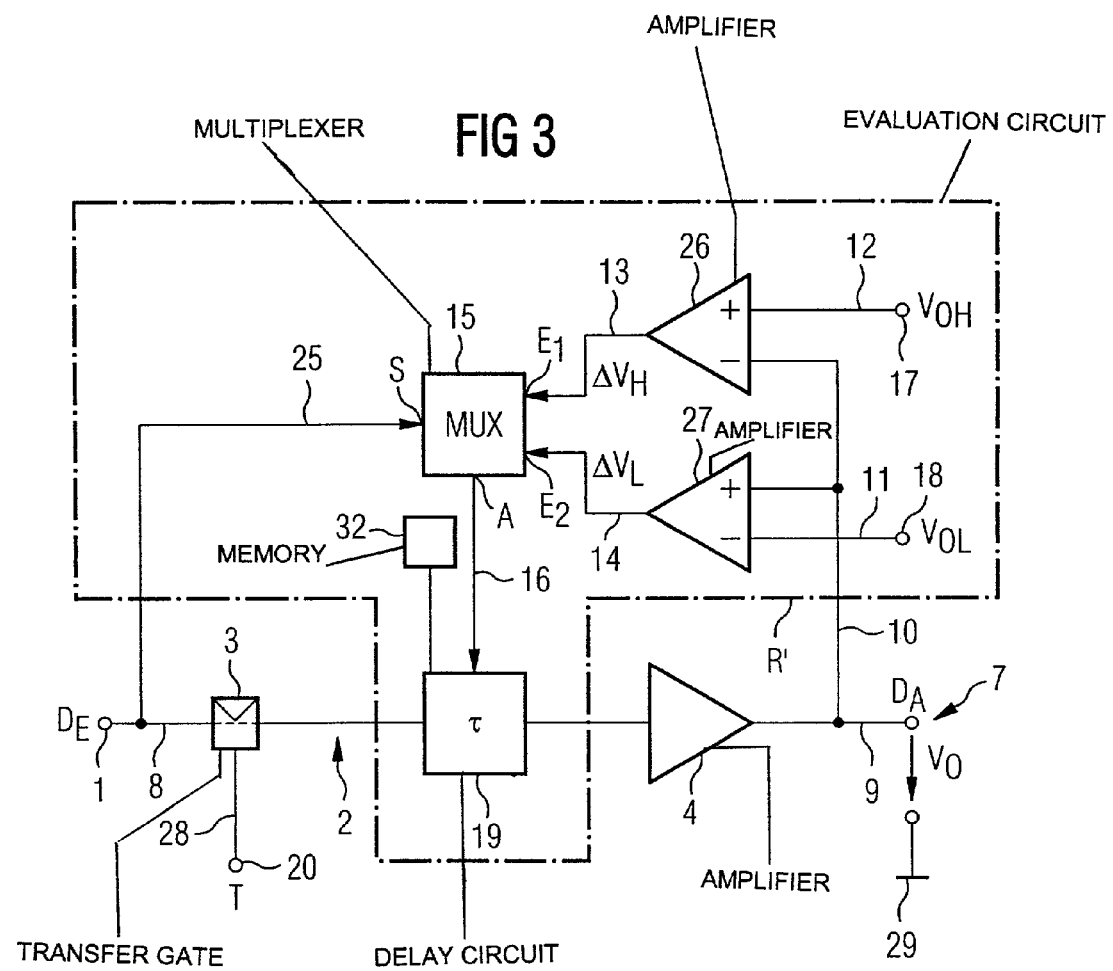

METHOD AND APPARATUS FOR TEMPORALLY CORRECTING A DATA SIGNAL

BACKGROUND OF THE INVENTION

Field of the Invention

The invention relates to a method and an apparatus for temporally correcting a data signal.

Data signals are exchanged between components designed, for example, as high-frequency digital components. In this case, data signals are used, for example, in the form of signal levels that alternate at a high frequency. The temporal position of the data signals is advantageous for precise further processing. By way of example, the signal levels of the data signals are altered by interference influences, as a result of which, the temporal position of predetermined signal levels with regard to reference times is also altered. When different data patterns are used, the temporal displacements of the data signals appear as statistical effects over long times. These effects are referred to as jitter.

SUMMARY OF THE INVENTION

It is accordingly an object of the invention to provide an apparatus and a method for temporally correcting a data signal with which it is possible to compensate for a temporal displacement of the data signal caused by interference influences.

With the foregoing and other objects in view there is provided, in accordance with the invention, a method for temporally correcting a data signal, that includes the following steps: detecting an analog signal level of a data signal; comparing the analog signal level with a reference value to obtain a comparison result; determining a displacement time in dependence on the comparison result; and forwarding the data signal such that the data signal is temporally delayed by the displacement time.

In accordance with an added mode of the invention, the method includes: defining a first difference by forming a difference between the signal level of the data signal and an upper reference value; defining a second difference by forming a difference between the signal level of the data signal and a lower reference value; and performing the step of determining the displacement time by using the difference selected from the group consisting of the first difference and the second difference based on the state of the next data signal.

In accordance with an additional mode of the invention, the method includes steps of: providing a table; determining values corresponding to displacement times as a function of difference values between the analog signal level of the data signal and reference values; storing in the table, the determined values corresponding to the displacement times; and reading out from the table, the determined values corresponding to the displacement times.

With the foregoing and other objects in view there is provided, in accordance with the invention, an apparatus that includes: a signal line for carrying a data signal having alternating signal levels; and a storage unit having an input connected to the data line and having a signal output. The storage unit is for storing the data signal for a predeterminable or settable time duration and for outputting the data signal at the signal output after the settable time duration. The apparatus includes a multiplexing device having a first input and a second input. The multiplexing device has a control input that is connected to the signal line. The apparatus also includes a delay circuit, and an evaluation unit connected to the signal output. The evaluation unit includes a first differential amplifier and a second differential amplifier. The first differential amplifier has a negative input that is connected to the signal output. The first differential amplifier has a positive input receiving an upper reference signal. The first differential amplifier has an output providing a first difference signal to the first input of the multiplexing device. The second differential amplifier has a negative input receiving a lower reference signal. The second differential amplifier has a positive input that is connected to the signal output. The second differential amplifier has an output providing a second difference signal to the second input of the multiplexing device. The multiplexing device receives the data signal from the signal line. The multiplexing device is configured for comparing one of the signal levels of the data signal with a reference value. The multiplexing device is configured for forwarding the first difference signal at the output of the first differential amplifier to the delay circuit if the one of the signal levels lies above the reference value. The multiplexing device is configured for forwarding the second difference signal at the output of the second differential amplifier to the delay circuit if the one of the signal levels lies below the reference value. The delay circuit is configured to determine a displacement time from a difference signal that is selected from the group consisting of the first difference signal and the second difference signal. The displacement time is utilized for performing a function that is selected from the group consisting of providing the data signal at the signal output in a delayed manner and forwarding a clock signal to the storage unit in a delayed manner.

In accordance with an added feature of the invention, there is provided, a clock source that is connected to the evaluation unit and that feeds a clock signal to the evaluation unit. The evaluation unit determines the displacement time from a comparison between the one of the signal levels of the data signal and the reference value. The evaluation unit outputs the clock signal to the storage unit in a manner that is temporally delayed by the displacement time. The storage unit receives the clock signal and outputs the data signal in accordance with the clock signal.

In accordance with an additional feature of the invention, the storage unit is a clocked transfer gate.

One advantage of the invention is that the signal level of the data signal is detected and compared with a reference value, and a displacement time is determined as a function of the comparison, the data signal being displaced by the displacement time. The displacement time is defined in such a way that the data signal has a predetermined signal level at a predetermined point in time. A temporal correction of the signal profile is performed in this way, thereby improving further processing of the data. The correction of the temporal profile of the data signal enables detection times for detecting the data signal to be made shorter, since the data signal has a precise profile with respect to time.

By way of example, it is advantageous to compare the signal level of the data signal with a lower or an upper reference value and, depending on the magnitude of the signal level, to use the difference between the signal level and the lower or the upper reference value for determining the displacement time. Deviations of the data signal from a high level state or a low level state are taken into account in this way.

In a simple embodiment, values for the displacement time are stored for difference values between the signal level and the upper or the lower reference value, with the result that the displacement time can be read out after a determination of the difference values via the table. Such a modified embodiment could be used quicker in the case of low-frequency signal sequences, since then there is enough time during a bit period to read out the table value from a table.

Other features which are considered as characteristic for the invention are set forth in the appended claims.

Although the invention is illustrated and described herein as embodied in a Method and apparatus for the temporal correction of a data signal, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 shows a first embodiment of an apparatus for temporally correcting a data signal;

FIG. 2 shows a signal diagram with an optimal, a disturbed and a corrected profile of a data signal; and FIG. 3 shows a second embodiment of the apparatus for temporally correcting the data signal.

DESCRIPTION OF THE PREFERRED EMBODIMENTS

Referring now to the figures of the drawing in detail and first, particularly, to FIG. 1 thereof, there is shown a signal input 1, via which a data signal $D_E$ is fed in. The signal input 1 is connected to a data signal source, which is designed for example in the form of a semiconductor memory. When data are read from the semiconductor memory, the data are output in the form of a high-frequency signal profile. The signal input 1 is connected to a transfer gate 3, via a first input line 8. The transfer gate 3 serves as a storage unit. The transfer gate 3 is connected to a delay circuit 19 via a fifth output line 22. The delay circuit 19 is connected to a clock source 20 via a fifth input line 21. The clock source 20 passes a clock signal as a time reference to the delay circuit 19. The delay circuit 19 passes a delayed clock signal to the transfer gate 3 via the fifth output line 22. The clock signal defines how long the data signal is buffer-stored in the transfer gate 3 and is subsequently output via an output to a signal line 2. The transfer gate 3 is connected to a signal amplifier 4 via the signal line 2. The signal amplifier 4 is connected to a signal output 7 via a first output line 9. The signal amplifier 4 amplifies the data signal fed by the transfer gate 3 and outputs the amplified data signal via the first output line 9 to the signal output 7. At the signal output 7, the amplified data signal can be detected relative to a ground potential 29, as a result of which the signal level of the data signal can be identified.

The first output line 9 is connected to a first input of a first differential amplifier 26 via a second input line 10. Moreover, the second input line 10 is connected to a second input of a second differential amplifier 27. The first differential amplifier 26 has a second input, which is connected to a first reference source 17 via a fourth input line 12. The first reference source 17 supplies an upper reference value VOH. The second differential amplifier 27 is connected by a first input to a second reference source 18 via a third input line 11. The second reference source 18 supplies a lower reference value VOL to the second differential amplifier 27.

The first differential amplifier 26 has an output connected to a first input of a multiplexing device 15 via a second output line 13. The second differential amplifier 27 has an output connected to a second input of the multiplexing device 15 via a third output line 14. Moreover, the multiplexing device 15 is connected to the first input line 8 via a sixth input line 25. Furthermore, the multiplexing device 15 has an output which is connected to an input of the delay circuit 19 via a fourth output line 16.

The method of operation of the apparatus illustrated in FIG. 1 is explained in more detail below with reference to the diagram shown in FIG. 2.

FIG. 2 shows an ideal signal profile of a first data signal S1, which has a signal level in accordance with a lower reference value VOL at the instant T0. At the instant T1, the signal level of the first data signal S1 rises and reaches a reference value Vref at a second instant T2. The signal level of the first signal S1 then rises further and reaches an upper reference value VOH at a third instant T3. The first data signal S1 represents an ideal data signal which changes from a lower reference value to an upper reference value at a predetermined point in time. As a result, the first data signal S1 has the predetermined reference value Vref precisely at the instant T2. Moreover, the first data signal S1 reaches the upper reference value at the predetermined instant T3. As a result, the temporal position of the first data signal S1 is precisely defined and the first data signal S1 can correspondingly be sampled or detected in the different states at precise points in time or time ranges. Consequently, sampling or detection times can be precisely prescribed. As a result, fast further processing of the data signal is possible, or the states in which the data signal must have a lower or an upper difference value can be shortened. This enables faster processing of the data signal. Furthermore, the invention affords the advantage that in components in which the invention is used, a larger yield is achieved in conjunction with higher speed classes.

On account of interference influences, however, a data signal does not always achieve the form and position of the first data signal S1, but rather has a signal level which is greater than the lower reference value VOL at the instant T0. A corresponding data signal is illustrated in FIG. 2 as a second data signal S2 in the form of a line. At the instant T0, the second data signal S2 has a lower difference value $\Delta V_L$ with respect to the lower reference value VOL. If the signal level of the second data signal S2 is then changed at the instant T1 in a curve to the upper reference value VOH, the second data signal S2 has a signal level lying above the reference value Vref at the predetermined second instant T2. Consequently, there is a discrepancy between the signal level of the second data signal S2 at the instant T2 and the optimal signal level of the first data signal S1 at the instant T2. Consequently, the reference value Vref is also reached at an earlier point in time than the second instant T2. As a result, the signal level of the second data signal S2 does not reach the upper reference value Vref at the predetermined optimal instant T2. Consequently, there is a temporal displacement of the temporal profile of the signal level of the second data signal S2 relative to an optimal temporal profile. The temporal displacement leads to greater inaccuracy with regard to the time periods when the second data signal reaches predetermined signal levels. For sampling and/or detection of the signal levels of the second data signal S2, this enables longer time periods and/or temporally staggered time periods with regard to an optimal data signal.

The apparatus shown in FIG. 1 corrects the temporal position of the second data signal S2 according to the following method: the second data signal S2 is detected at the instant T0, which lies shortly before the instant T1, downstream of the signal amplifier 4 by the first and the second differential amplifier 26, 27. The first differential amplifier 26 forms an upper difference value $\Delta V_H$ between the detected signal level $V_O$ and the upper reference value $V_{OH}$ according to the following formula:

$$\Delta V_H = |V_{OH}| - |V_O|.$$

The upper difference value $\Delta V_H$ is applied to the first input of the multiplexing device 15.

The second differential amplifier 27 determines a lower difference value $\Delta V_L$ according to the following formula:

$$\Delta V_L = |V_{OL}| - |V_O|,$$

where VOL designates the lower reference value. This lower difference value $\Delta V_L$ is applied to a second input of the multiplexing device 15.

The multiplexing device 15 evaluates the signal level of the datasignal fed in via the sixth input line 25, in such a way that the signal level fed to it is compared with the reference value Vref. If the signal level lies above the reference value Vref1 then the multiplexing device 15 forwards the lower difference value $\Delta V_H$ to the delay circuit 19. If the signal level fed in via the sixth input line 25 is less than the reference value $V_{ref}$, then the multiplexing device 15 forwards the upper difference value $\Delta V_L$ via the fourth output line 16 to the delay circuit 19. In a simple embodiment of the invention, the delay circuit 19 is connected to a memory 32. In the memory 32, a table is stored in which displacement times are stored as a function of lower and/or upper difference values $\Delta V_L$, $\Delta V_H$, with which displacement times the clock signal fed by the clock source 20 is forwarded in a temporally delayed manner via the fifth output line 22 to the transfer gate 2. Having received the clock signal, the transfer gate 3 forwards the stored data signal to the signal line 2. Depending on how long the clock signal is output in a delayed manner by the delay circuit 19, the data signal is also output in a temporally delayed manner to the signal amplifier 4 and thus to the signal output 7.

In a preferred embodiment, the delay circuit 19 has resistances and capacitances. Either the resistances or the capacitances are set in a manner depending on the output voltage of the multiplexer 15. The delay time of the clock signal of the clock source 20 is thus defined in a manner depending on the output voltage of the multiplexer 15. For example, a channel resistance of a transistor is set by way of the gate voltage which is prescribed by the multiplexer 15. In another embodiment, for example, a junction capacitance of a MOS transistor is altered by way of the gate voltage which is prescribed by the multiplexer 15.

If the delay circuit 19 identifies the presence of a lower difference value $\Delta V_L$, then the delay circuit 19 delays the forwarding of the clock signal of the clock source 20 to the transfer gate 3 by a displacement time which depends on the lower difference value. As a result, the transfer gate 3 outputs the data signal onto the signal line 2 at a later time. Consequently, the delayed data signal S2' has a temporal position which, starting at the later instant T4, corresponds to the signal profile of the optimal first data signal S1. The temporally delayed time signal S2' is illustrated in the form of circles in FIG. 2. On account of the temporal delay, the temporal signal profile of the data signal S2' is again adapted to the optimal time profile. The delay circuit 19 thus delays the clock signal by the displacement time which corresponds to the difference between the fourth and the first instant. The delayed time signal S2' is amplified by the signal amplifier 4 and supplied to the signal output 7. As a result, a corrected data signal having an optimal time profile is present at the signal output 7.

FIG. 2 illustrates, as an exemplary embodiment, a second data signal S2 having a signal level which lies below the reference value $V_{ref}$ at the instant T0. However, the apparatus according to the invention also functions for a second data signal S2 having a signal level which lies above the reference value Vref at the instant T0. In the case of this signal level, the corresponding upper difference value $DV_H$ is similarly forwarded to the delay circuit 19 via the multiplexing device 15. On the basis of the upper difference value $\Delta V_H$, the delay circuit 19 determines a displacement time with which the timing clock signal of the clock source 20 is forwarded to the transfer gate 3 in a temporally delayed manner. Consequently, a correction of the temporal position is also achieved in the case of this signal level.

FIG. 3 shows a further embodiment of the apparatus, which is essentially constructed in a manner corresponding to that shown in FIG. 1. However, in the embodiment of FIG. 3, the delay circuit 19 is connected between the transfer gate 3 and the signal amplifier 4. In this embodiment, the transfer gate 3 is directly connected to the clock source 20 via a seventh input line 28. Consequently, the data signal passed via the input line 8 is buffer-stored in the transfer gate 3 and output onto the signal line 2 in accordance with the clock signal fed by the clock source 20. The data signal is then buffer-stored once again in the delay circuit 19. The time duration of the buffer-storage corresponds to the displacement time period which was determined on the basis of the upper or lower difference value $\Delta V_H$, $\Delta V_L$ by the delay circuit 19. Consequently, in this embodiment, contrary to the embodiment of FIG. 1, the clock signal of the clock source 20 is not forwarded in a delayed manner, rather the data signal itself is buffer-stored by the delay circuit 19 for the displacement time and then output to the signal amplifier 4. Consequently, the temporal delay of the data signal is independent of the use of a clocked buffer storage device such as the transfer gate 3 and can also be used with circuit arrangements in which there is no clocked buffer-storage.

I claim:

1. A method for temporally correcting a data signal, which comprises:
    detecting an analog signal level of a data signal;
    comparing the analog signal level with a reference level value to obtain a difference value by the steps of;
        defining a first difference by forming a difference between the signal level of the data signal and an upper reference value; and
        defining a second difference by forming a difference between the signal level of the data signal and a lower reference value;
    determining a displacement time in dependence on the difference value by using the difference selected from the group consisting of the first difference and the second difference based on a state of a next data signal; and
    forwarding the data signal such that the data signal is temporally delayed by the displacement time.

2. The method according to claim 1, which comprises providing the data signal with a signal profile that changes back and forth between at least two signal levels.

3. The method according to claim 1, which comprises providing the data signal with a signal profile that changes back and forth between at least two signal levels.

4. The method according to claim 1, which comprises:
providing a table;
determining values corresponding to displacement times as a function of difference values between the analog signal level of the data signal and reference values;
storing in the table, the determined values corresponding to the displacement times; and
reading out from the table, the determined values corresponding to the displacement times.

5. An apparatus comprising:
a signal line for carrying a data signal having alternating signal levels;
a storage unit having an input connected to said data line and having a signal output, said storage unit for storing the data signal for a settable time duration and for outputting the data signal at said signal output after the settable time duration;
a multiplexing device having a first input and a second input, said multiplexing device having a control input that is connected to said signal line;
a delay circuit; and
an evaluation unit connected to said signal output, said evaluation unit including a first differential amplifier and a second differential amplifier;
said first differential amplifier having a negative input that is connected to said signal output, said first differential amplifier having a positive input receiving an upper reference signal, said first differential amplifier having an output providing a first difference signal to said first input of said multiplexing device;
said second differential amplifier having a negative input receiving a lower reference signal, said second differential amplifier having a positive input that is connected to said signal output, said second differential amplifier having an output providing a second difference signal to said second input of said multiplexing device;
said multiplexing device receiving the data signal from said signal line, said multiplexing device configured for comparing one of the signal levels of the data signal with an average reference value;
said multiplexing device configured for forwarding the first difference signal at said output of said first differential amplifier to said delay circuit if the one of the signal levels lies above the average reference value;
said multiplexing device configured for forwarding the second difference signal at said output of said second differential amplifier to said delay circuit if the one of the signal levels lies below the average reference value;
said delay circuit configured to determine a displacement time from a difference signal that is selected from the group consisting of the first difference signal and the second difference signal; and
the displacement time is utilized for performing a function that is selected from the group consisting of providing the data signal at said signal output in a delayed manner and forwarding a clock signal to said storage unit in a delayed a manner.

6. The apparatus according to claim 5, comprising:
a clock source that is connected to said evaluation unit and that feeds a clock signal to said evaluation unit;
said evaluation unit determining the displacement time from a comparison between the one of the signal levels of the data signal and the reference value;
said evaluation unit outputting the clock signal to said storage unit in a manner that is temporally delayed by the displacement time; and
said storage unit receiving the clock signal and outputting the data signal in accordance with the clock signal.

7. The apparatus according to claim 6, wherein said storage unit is a clocked transfer gate.

* * * * *